(12) United States Patent
Döring et al.

(10) Patent No.: US 6,541,776 B1
(45) Date of Patent: Apr. 1, 2003

(54) DEVICE FOR ELECTROSTATIC DEFLECTION OF A PARTICLE BEAM

(75) Inventors: Hans-Joachim Döring, Jena (DE); Thomas Elster, Jena (DE)

(73) Assignee: Leica Microsystems Lithography GmbH, Jena (DE)

( * ) Notice: Subject to any disclaimer, the term of this patent is extended or adjusted under 35 U.S.C. 154(b) by 0 days.

(21) Appl. No.: 09/510,959

(22) Filed: Feb. 22, 2000

(30) Foreign Application Priority Data

Feb. 24, 1999  (DE) .......................................... 199 07 858

(51) Int. Cl.[7] .............................................. G01N 23/00
(52) U.S. Cl. ................................. 250/396 R; 250/492.2
(58) Field of Search ........................ 250/396 R, 492.23, 250/492.22, 492.2, 310; 315/370

(56) References Cited

U.S. PATENT DOCUMENTS

| | | | | |
|---|---|---|---|---|
| 4,002,912 A | * | 1/1977 | Johnson | 250/307 |
| 4,142,132 A | * | 2/1979 | Harte | 315/370 |
| 4,942,342 A | * | 7/1990 | Tsukakoshi | 315/410 |
| 4,962,309 A | * | 10/1990 | White et al. | 250/396 ML |
| 4,983,833 A | * | 1/1991 | Brunner et al. | 250/310 |
| 5,245,194 A | * | 9/1993 | Oae et al. | 250/396 R |
| 5,481,164 A | * | 1/1996 | Langner et al. | 250/396 ML |
| 5,600,146 A | * | 2/1997 | Felker et al. | 250/396 R |
| 5,821,543 A | * | 10/1998 | Moran | 250/396 R |

FOREIGN PATENT DOCUMENTS

| | | |
|---|---|---|
| DE | 31 38 898 A1 | 4/1983 |
| JP | 2-94346 A | 4/1990 |

* cited by examiner

*Primary Examiner*—John R. Lee
*Assistant Examiner*—Anthony Quash
(74) *Attorney, Agent, or Firm*—Hodgson Russ LLP

(57) ABSTRACT

The invention refers to a device for electrostatic deflection of a particle beam out of a primary beam direction for the purpose of scanning a plane spanned by two coordinates X, Y, in which multiple electrodes configured as deflection wires are connected to an activation circuit and are acted upon, depending on the activation, by modifiable deflection voltages; the primary beam direction intersects the origin of coordinates X and Y, and the respective applied deflection voltage is an equivalent for the deflection of the particle beam out of the primary beam direction in the direction of coordinate X or coordinate Y. In such a device, the deflection wires are linked into deflection grids and are joined to one another and to the activation circuit in such a way that an equivalent deflection voltage is always applied to all deflection wires belonging to one and the same deflection grid.

12 Claims, 4 Drawing Sheets

DEVICE FOR ELECTROSTATIC DEFLECTION OF A PARTICLE BEAM

CROSS REFERENCE TO RELATED APPLICATIONS

Reference is made to the German Patent Application 199 07 858.0-33 from which the present application claims piority.

FIELD OF THE INVENTION

This invention relates a device for electrostatic deflection of a particle beam out of a primary beam direction for the purpose of scanning a plane spanned by two coordinates X, Y, in which multiple electrodes configured as deflection wires are connected to an activation circuit and are acted upon, depending on the activation, by modifiable deflection voltages. In this context the "primary beam direction" is to be understood as the direction of the undeflected particle beam which intersects the origin of the coordinates X, Y; the deflection voltages are an equivalent for the deflection of the particle beam out of the primary beam direction in the direction of coordinate X or coordinate Y.

BACKGROUND OF THE INVENTION

In particle beam equipment, for example in electron-beam and ion-beam exposure systems for exposing wafers, devices are necessary for deflecting the particle beam over the surface that is to be exposed.

In deflection devices of this kind, which are often also called deflection systems, the change in the direction of the particle beam is accomplished, in principle, by the influence of magnetic or electrostatic forces. Also known are deflection devices in which both principles are utilized in succession in the beam direction.

If the deflection of the particle beam is to take place quickly and accurately, electrostatic deflection systems are preferred. In such systems, multiple deflection electrodes are acted upon by different voltage potentials, thereby generating an electrostatic field that, depending on the change in voltage potentials and the activation of the deflection electrodes, acts on the particle beam so as to change its direction. Activation is accomplished in such a way that the particle beam is deflected out of a primary beam direction (which corresponds to the undeflected beam path) into a desired direction, and is guided as a function of the change in activation over a plane spanned by the coordinates X, Y.

Electrostatic deflection systems in which the deflection electrodes are configured in the form of wires that extend, over part of their length, parallel to the primary radiation direction, have recently been developed. One such deflection system is described in the German Patent Application DE 31 38 898 A1. In this, eight wires are arranged in radially symmetrical fashion around the primary beam direction. The wires are attached at their ends to insulators. The attachment positions on the insulators determine the location and orientation of the wires relative to the particle beam. The arrangement disclosed in DE 31 38 898 A1 of the wires with respect to the primary radiation direction is illustrated in FIG. 1 of the present specification.

One disadvantage of this device as compared to previously known deflection systems, in which electrodes were arranged distributed in the form of cylindrical or circular segments around the primary beam direction, is the fact that deflection sensitivity is lower, and moreover that greater complexity is involved in activating the electrodes, since mixed deflection potentials must be generated (cf. page 4 of DE 31 38 898 A1, lines 5 through 7). The mixed deflection potentials, for example $U_4=(U_y+U_x)/\sqrt{2}$, are necessary so that the electrostatic field is at least approximately homogeneous.

The wire deflection system described above thus exhibits poorer practical value characteristics than the previously known existing art. As a result, its actual advantage—namely simplicity of manufacture—cannot be effectively utilized, especially for applications in which rapid and accurate deflection of the particle beam is desired.

SUMMARY OF THE INVENTION

Proceeding therefrom, it is the object of the invention to develop deflection systems of the kind described above in such a way that practical value characteristics are improved while retaining the advantages in terms of production engineering.

According to the invention, in deflection systems of this kind multiple deflection wires are linked into deflection grids, the deflection wires being joined to one another and to the activation circuit in such a way that an equivalent deflection voltage is always applied to all deflection wires belonging to one and the same deflection grid.

In a preferred embodiment of the invention, provision is made for multiple deflection grids to be allocated to the X coordinate and for the deflection wires of those deflection grids to be arranged symmetrically with respect to the Y coordinate; and/or for multiple deflection grids to be allocated to the Y coordinate and for the deflection wires of those deflection grids to be arranged symmetrically with respect to the X coordinate.

It has thereby been advantageously possible to achieve high field homogeneity even without the complex provision of mixed deflection potentials. It has moreover been possible, by suitable positioning of multiple deflection wires as will be explained in further detail below, to suppress in simple fashion the higher-order Fourier harmonics of the electrostatic potential, thus improving the field homogeneity even further. The application of the same potential to multiple deflection wires has advantageously resulted in an elevated deflection sensitivity for the entire deflection system.

A particularly preferred embodiment of the invention provides for two deflection grids to be allocated in each case to the X coordinate and to the Y coordinate. The deflection grids allocated to the X coordinate are located opposite one another symmetrically with respect to the Y coordinate; the deflection grids allocated to the Y coordinate are located opposite one another symmetrically with respect to the X coordinate. A voltage potential $\pm U_X$ is provided between the deflection grids allocated to the X coordinate, and a voltage potential $\pm U_Y$ is provided between the deflection grids allocated to the Y coordinate. The deflection of the particle beam out of the primary radiation direction is effected as a function of the change in the voltage applied to the deflection grids.

In further embodiments of the invention, at least two deflection wires of one and the same deflection grid are arranged at different spacings from the origin of the X and Y coordinates. In other words, the spacings between the deflection wires and the undeflected particle beam are of different magnitudes for at least two deflection wires of a deflection grid. In this context, provision can advantageously be made for the cross-sectional center points of all the deflection wires to be distributed on circumferential lines of multiple concentric circles $k_1$, $k_2$ through $k_n$, these circles also being oriented concentrically with respect to the coordinate origin or the undeflected particle beam. As a result, the spacings of the deflection wires that belong to one and the same deflection grid are defined with respect to the undeflected particle beam via the radii $r_1$, $r_2$ through $r_n$ of circles $k_1$, $k_2$ through $k_n$.

An embodiment that is particularly favorable in terms of field homogeneity results, for example, if a total of four deflection grids are provided, each deflection grid being constituted from six deflection wires, the deflection wires of all the deflection grids being arranged distributed on circumferential lines of three circles $k_1$, $k_2$, $k_3$ having radii $r_1 < r_2 < r_3$, and each of circles $k_1$, $k_2$ and $k_3$ being occupied by two deflection wires of each grid.

In this context, the ratio of the radii $r_1:r_2:r_3$ should be approximately 1:1.1:1.21. The arc length $b_1$ between the two deflection wires of a grid on circle $k_1$, the arc length $b_2$ between the two deflection wires of a grid on circle $k_2$, and the arc length $b_3$ between the two deflection wires of a grid on circle $k_3$ should be related to one another as 8:1:14.

It is advantageous in this context to embody arc length $b_1$ within the range of values from 5 mm to 10 mm. Deflection voltages $\pm U_X$ and $\pm U_Y$ should lie in the range of values up to $\pm 100$ volts.

Very good results in terms of field homogeneity and deflection sensitivity have been obtained therewith, especially in applications in electron-beam lithography. With this embodiment, field inhomogeneities—considered in a section perpendicular to the undeflected particle beam—are optimally suppressed; in particular, the second- to seventh-order Fourier harmonics of the electrostatic potential are reduced toward "zero."

Other ratio values and orders of magnitude can of course also be selected, and differing results will then naturally be obtained. It is moreover also conceivable for circumferential lines of circles not, or not exclusively, to be selected as the basis for the fundamental structure of the arrangement, but rather for other geometrical figures (e.g. rectangles, octagons, and the like) to be taken as the basis. What is always essential in terms of function in this context is that the deflection wires are to be arranged on these circumferential lines symmetrically with respect to the X coordinate axis and/or symmetrically with respect to the Y coordinate axis.

The material to be provided for the deflection wires is preferably gold, platinum, tungsten, aluminum, or copper, or also an alloy of one or more of these metals with silicon. The diameter of the deflection wires should be between 10 $\mu$m and 200 $\mu$m.

In addition to the advantageous effect in terms of improving field homogeneity and enhancing deflection sensitivity, the simple configuration also results in good technological conditions for high manufacturing accuracy of a deflection device of this kind.

The deflection device according to the present invention is preferably usable for equipment for generating exposed patterns on wafers or masks in the semiconductor production process. The advantageous effect found here is in particular the fact that the deflection wires present a small surface area to the particle-based optical radiation used for exposure, so that charging, which could result in undesirable effects on the direction of the particle beam, is largely suppressed.

An additional advantage is the fact that because of the relatively small wire surface area, the field strength resulting from charging of a deflection wire with the respective deflection current is high, so that undesired charging is rapidly dissipated.

A further essential advantage of the arrangement according to the present invention is the fact that because of the plurality of deflection wires, voltage potentials that are directed from outside onto the deflection system are largely blocked in terms of their effect on the particle beam.

Because of the broad range of possible variations in terms of the arrangement of the thin wires, aberrations in particle optics can be suppressed substantially better than is the case with known solutions having few deflection electrodes. With a deflection system according to the present invention that has twenty-four deflection wires, for example, the inhomogeneities of the electrostatic field in the section plane perpendicularly through the primary beam direction are optimally suppressed for the reasons already set forth.

It is important, in the manufacture of the device according to the present invention, that the positional deviations of the deflection wires from their predefined positions be minimized so that the aberrations caused by positional inaccuracies also assume a negligible magnitude in terms of optical imaging quality. Because the assemblies are uncomplicated, however, this is easy to bring about.

BRIEF DESCRIPTION OF THE DRAWINGS

The subject matter of the invention is described with reference to the embodiments shown in the drawings.

DETAILED DESCRIPTION OF THE INVENTION

Figure 1:
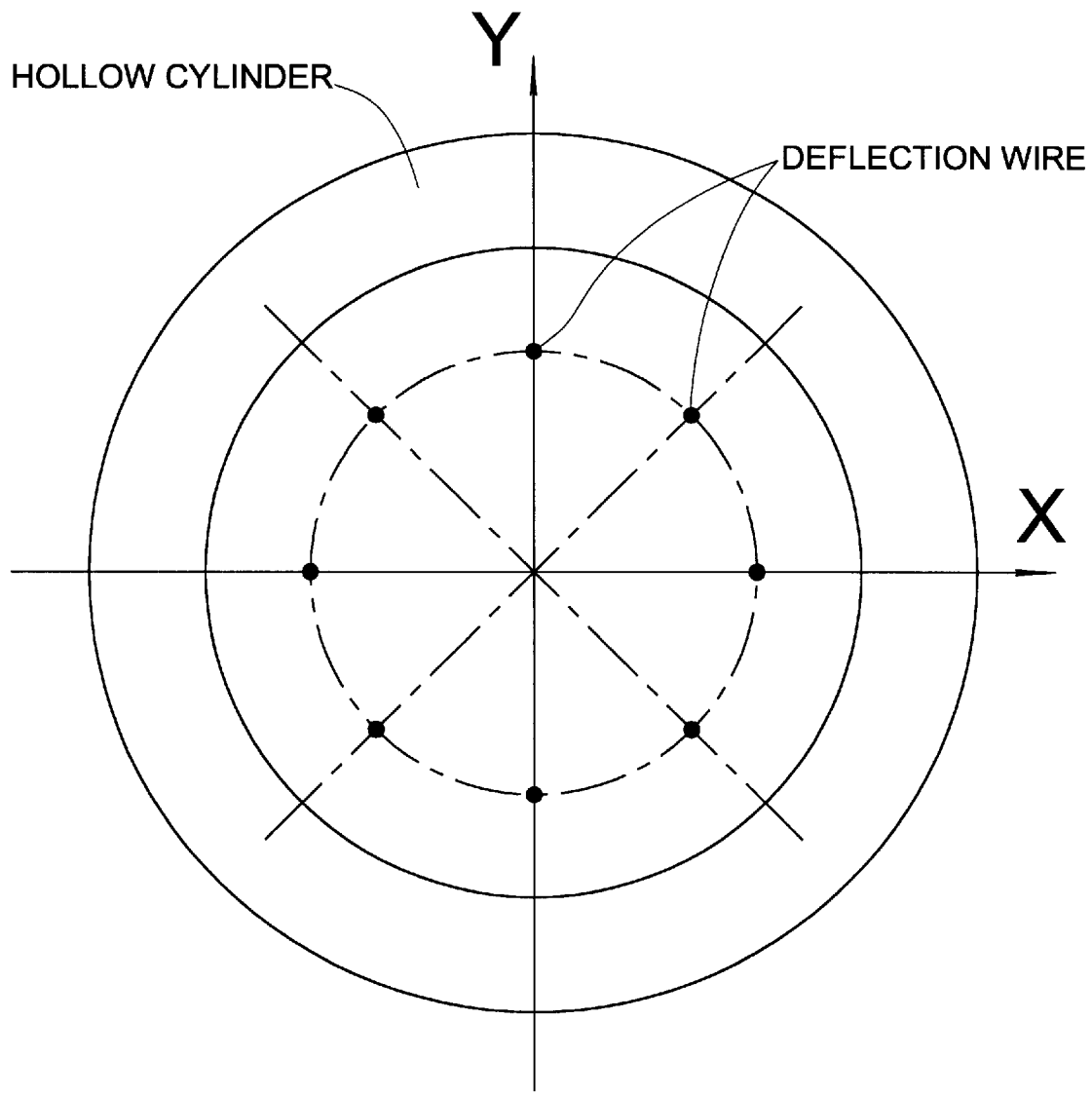
FIG. 1 shows the existing art.

An explanation of FIG. 1, which depicts an arrangement of deflection wires according to the prior art, is already contained in the introduction to the Specification, and therefore does not require repetition here.

Figure 2:
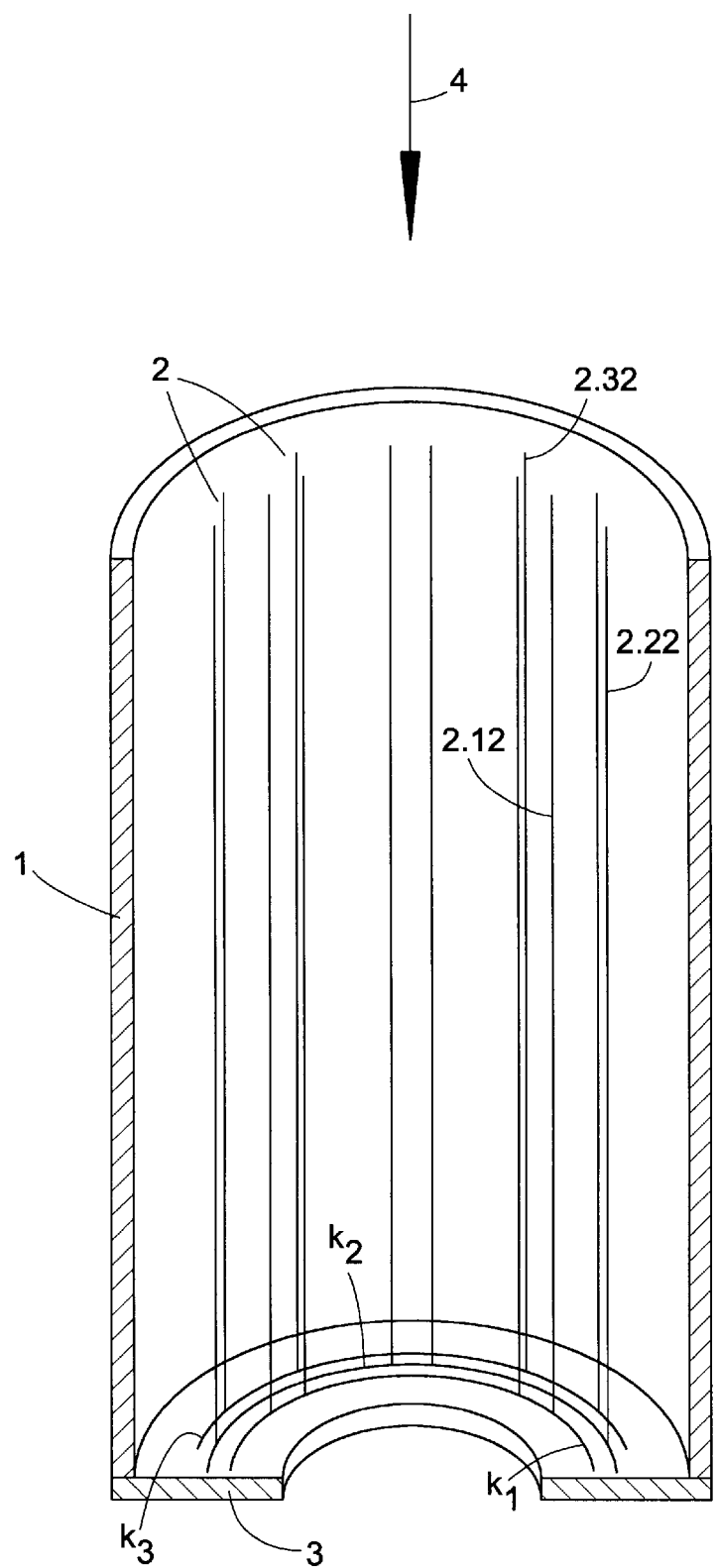
FIG. 2 shows the arrangement according to the present invention in a schematic depiction.

In FIG. 2, which is a schematic depiction of the arrangement according to the present invention, deflection wires 2 are stretched inside a hollow cylinder 1 that preferably is produced from an electrically nonconductive material and is coated on its inner surface with an electrically conductive material. The ends of deflection wires 2 are joined to insulating plates, of which only insulating plate 3 is depicted in FIG. 2 for reasons of clarity. Each of deflection wires 2 is attached at one of its ends to insulating plate 3. At their other ends, deflection wires 2 are joined to the second insulating plate (not depicted), which is located at the opposite end of hollow cylinder 1.

Deflection wires 2 are aligned parallel to primary beam direction 4, which corresponds to the undeflected beam direction of the particle beam. Be it noted in this connection as a precaution that the embodiment of the deflection device according to the present invention is not limited to parallel alignment of deflection wires 2 with respect to primary beam direction 4; embodiments in which at least individual deflection wires 2 are inclined with respect to primary beam direction 4 are also conceivable.

Figure 3:
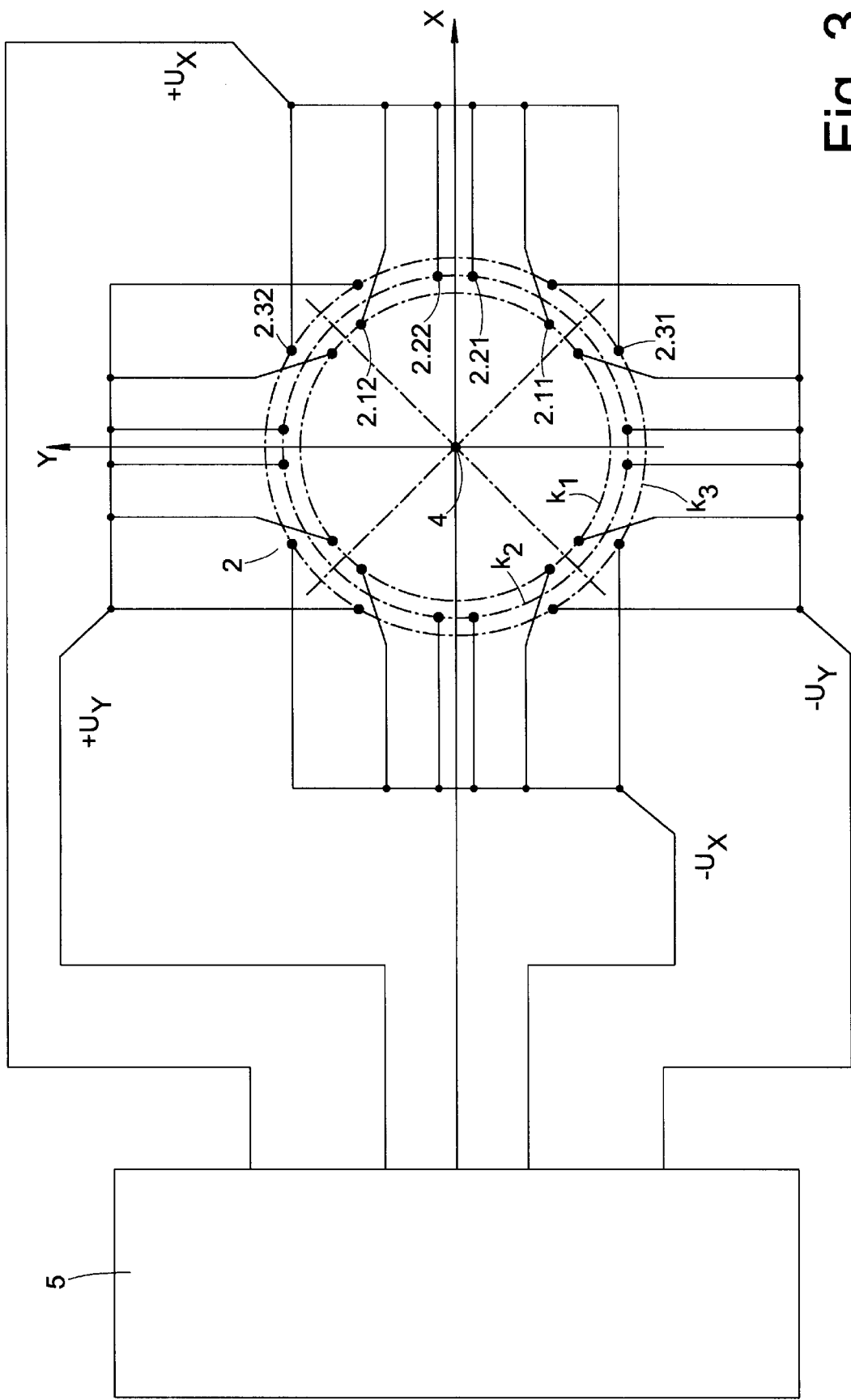
FIG. 3 shows the arrangement of a wire cross sections in a section perpendicular to the primary radiation direction.

FIG. 3, which is a plan view of hollow cylinder 1 of FIG. 2, depicts the positioning of the deflection wires with respect to one another and relative to the origin of coordinates X and Y, their combination into deflection grids, and their connection to an activation circuit 5. It is evident that a total of twenty-four deflection wires 2 are provided. Deflection wires 2 are positioned both symmetrically with respect to coordinate axis X and symmetrically with respect to coordinate axis Y. According to the present invention, deflection wires 2 are combined in groups into deflection grids; deflection wires 2 belonging to one and the same deflection grid have different spacings from the coordinate origin or from the undeflected particle beam, which is depicted as primary beam direction 4. For example, deflection wires 2.11, 2.12, 2.21, 2.22, 2.31, and 2.32 belong to one deflection grid to which the modifiable voltage $+U_X$ is applied.

The other eighteen deflection wires 2 are combined into three further grids; once again, six deflection wires 2 (which are not, for the sake of clarity, labeled with individual reference characters) belong to each grid, and the variable voltages $-U_X$, $+U_Y$ and $-U_Y$ are applied to them.

The principle of the device according to the present invention will now be explained further with reference to the grid having the applied voltage $+U_X$. In this connection, it is evident from FIG. 3 that the cross-sectional center points of deflection wires 2.11, 2.12, 2.21, 2.22, 2.31, and 2.32 are positioned on the circumferential lines of three circles $k_1$, $k_2$ and $k_3$ which are concentric with the coordinate origin or with primary beam direction 4. Let it be assumed that the radii of these circles $k_1$, $k_2$, $k_3$ are quantitatively related in the ratio $r_1:r_2:r_3=1:1.1:1.21$.

Be it noted in this connection that the subject matter of the invention is not limited to the indicated number of three circles, but rather that a different number of circles can be provided, and the ratios among the radii of these circles can also be defined differently.

It is further evident from FIG. 3 that two deflection wires 2.11 and 2.12 of the deflection grid to which the deflection voltage $+U_x$ is applied are allocated to circle $k_1$. Two deflection wires 2.21 and 2.22 are allocated to circle $k_2$ and two deflection wires 2.31 and 2.32 to circle $k_3$.

The arc length between deflection wires 2.11 and 2.12 on circle $k_1$, the arc length between deflection wires 2.21 and 2.22 on circle $k_2$, and the arc length between deflection wires 2.31 and 2.32 on circle $k_3$ are related to one another as approximately 8:1:14. In this context, the absolute value of the arc length between deflection wires 2.11 and 2.12 can be embodied in the range from 5 mm to 10 mm.

Deflection wires 2 allocated to the other deflection grids are positioned analogously to this arrangement. The deflection wires of two of the grids allocated to coordinate Y, which are acted upon by the voltage potential $\pm U_X$, are located opposite one another symmetrically with respect to coordinate axis Y. A further two grids that are acted upon by voltage potential $\pm U_Y$ are located opposite one another symmetrically with respect to coordinate axis X. The result is therefore also, at the same time, an arrangement in which the deflection grids are positioned, each offset by a 90-degree rotation with respect to one another, about the undeflected particle beam.

It should also be noted in this connection that other configurations for the arrangement of the individual deflection grids relative to the coordinate origin or to coordinate axes X and Y are also conceivable. For example, the radial symmetry in the arrangement of the four deflection grids is not absolutely necessary; instead, the deflection grids respectively allocated to a coordinate axis X or Y can differ from one another in terms of the number of deflection wires and in terms of the positioning of those deflection wires.

It is further evident from FIG. 3 that deflection wires 2 which belong to one deflection grid are each linked via activation lines to one another and to the output of activation circuit 5 which carries the respective potential $+U_X$, $-U_X$, $+U_Y$ and $-U_Y$.

Figure 4:
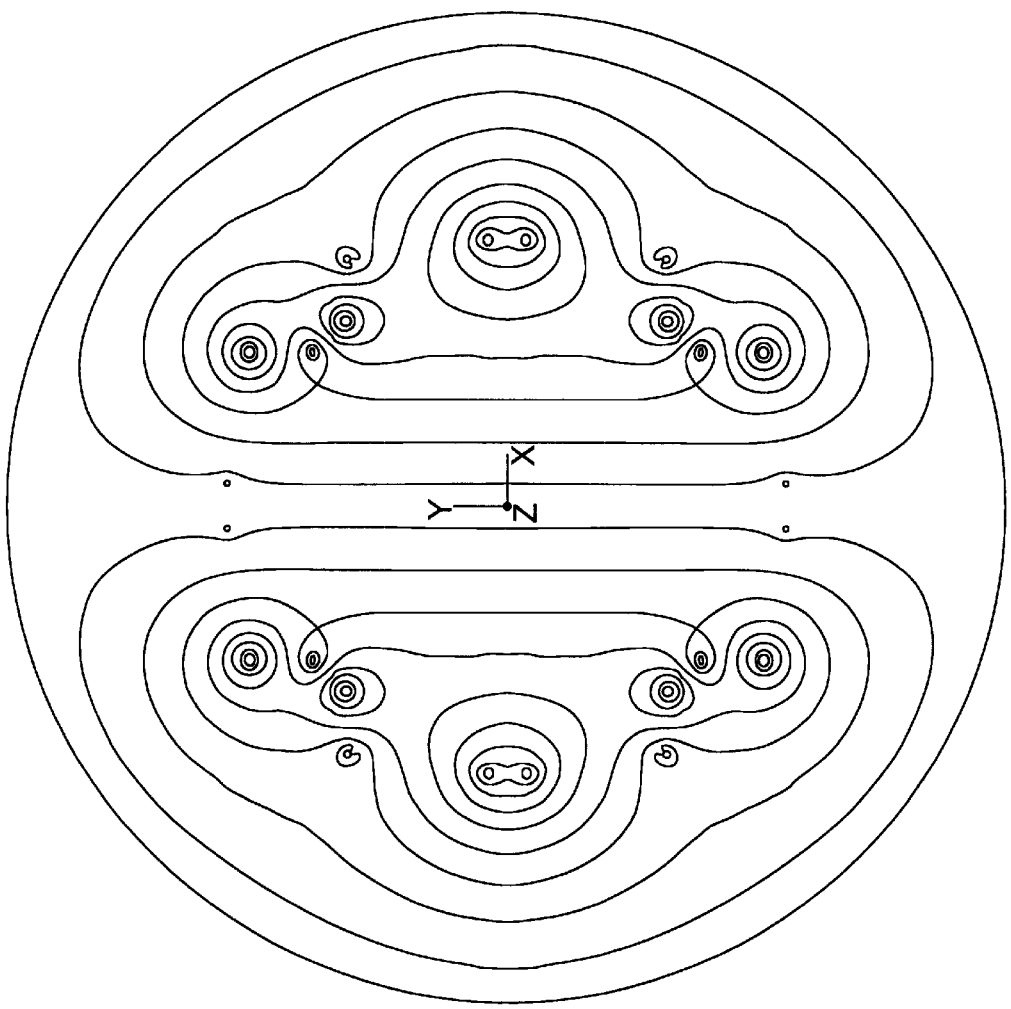
FIG. 4 shows the configuration of an electric field during operation of the device according to the present invention.

This arrangement generates an electrostatic field as depicted in FIG. 4 if the activation voltages applied, for example, to the deflection grids result in values of 0 volts for $\pm U_Y$ and values from $\pi 0$ to $\pm 100$ volts for $\pm U_X$.

In different embodiments of the invention, all the deflection wires can be made integrally from the same material, for example gold, platinum tungsten, aluminum, copper, tantalum, titanium, molybdenum, or alloys of one or more of the aforesaid metals and silicon. Different materials can also be provided for individual wires or groups of wires.

A particularly preferred embodiment of the invention furthermore consists, for example, in the fact that the wires are produced from metals having a high melting point of, for example, 1650° C. With such an arrangement, if contamination layers have become deposited on the deflection wires as a result of operation, it is possible to perform a cleaning, without damage to the wires, by annealing in a vacuum.

In a further preferred embodiment of the invention, provision can be made for individual (or indeed all) deflection wires to be biased by way of associated spring elements; the spring constants of the spring elements should be coordinated with the tensile strength of the wires so that the latter do not break even under operating conditions. An alternative to biased with spring elements is to pre-stretch the wires utilizing their own elasticity. Here again, the permissible tensile strength under operating conditions should not be exceeded.

Parts List

1 Hollow cylinder
2 Deflection wires
2.11, 2.12 Deflection wire pair
2.21, 2.22 Deflection wire pair
2.31, 2.32 Deflection wire pair
3 Insulator
4 Primary radiation direction
5 Activation circuit

What is claimed is:

1. A device for electrostatic deflection of a particle beam out of a primary beam direction for the purpose of scanning a plane spanned by two coordinates X, Y, the device comprising:

multiple electrodes which are configured as deflection wires extending in a Z direction orthogonal to the scanned plane, and the deflection wires are connected such that they form a plurality of deflection grids each having more than one deflection wire;

an activation circuit which is connected to the deflection wires and acts upon the deflection wires by modifying deflection voltages which are an equivalent for the deflection of the particle beam out of the primary beam direction in the direction of coordinate X and coordinate Y; and a deflection voltage of the same magnitude is applied to all the deflection wires belonging to the same deflection grid.

2. The device as defined in claim 1, wherein multiple deflection grids are allocated to the X coordinate and the deflection wires of those deflection grids are arranged symmetrically with respect to the Y coordinate.

3. The device as defined in claim 1, wherein multiple deflection grids are allocated to the Y coordinate and the deflection wires of those deflection grids are arranged symmetrically with respect to the X coordinate.

4. The device as defined in claim 1, wherein multiple deflection grids are allocated to the X coordinate and the deflection wires of those deflection grids are arranged symmetrically with respect to the Y coordinate; and multiple deflection grids are allocated to the Y coordinate and the deflection wires of those deflection grids are arranged symmetrically with respect to the X coordinate.

5. The device as defined in claim 4, wherein two deflection grids are allocated to the X coordinate, a voltage potential $\pm U_X$ being provided between the deflection wires of these two deflection grids; and two deflection grids are also allocated to the Y coordinate, a voltage potential $\pm U_Y$ being provided between its deflection wires.

6. The device as defined in claim 1, wherein at least two of the deflection wires belonging to one deflection grid are arranged at different distances from the origin of the X and Y coordinates.

7. The device as defined in claim 6, wherein each the deflection wires define a cross-sectional center point and all the deflection wires are distributed, with respect to their cross-sectional center point, on circumferential lines of multiple concentric circles centered around the coordinate origin.

8. The device as defined in claim 7, wherein the deflection wires are distributed on the circumferential lines of a circle $k_1$, a circle $k_2$, and a circle $k_3$ having respective radii $r_1$, $r_2$, $r_3$ according to the equation:

$$r_1 < r_2 < r_3,$$

and each of said circles $k_1$, $k_2$, and $k_3$ has two deflection wires of a deflection grid.

9. The device as defined in claim 8, wherein the ratio of the radii $r_1 : r_2 : r_3$ is approximately 1:1.1:1.21, and the arc length between the deflection wires of a grid on circle $k_1$, the arc length between the deflection wires of a grid on circle $k_2$, and the arc length between the deflection wires of a grid on circle $k_3$ are related to one another as approximately 8:1:14.

10. The device as defined in claim 9, wherein the arc length between the deflection wires of the deflection grid on circle $k_1$ is between 5 mm and 10 mm.

11. The device as defined in claim 1, wherein the deflection voltage is between −100 to +100 volts.

12. The device as defined in claim 1, wherein the material the deflection wires are made of consists essentially of the group gold, platinum, tungsten, aluminum, copper, tantalum, titanium, molybdenum, and an alloy of one or more of the aforementioned metals and silicon.

* * * * *